United States Patent
Macchi

[19]

[11] Patent Number: 6,125,463
[45] Date of Patent: Sep. 26, 2000

[54] INTEGRATED CIRCUIT WITH SERIAL TEST INTERFACE AND LOGIC FOR LOADING A FUNCTIONAL REGISTER USING SAID INTERFACE

[75] Inventor: Alberto Macchi, Milan, Italy

[73] Assignee: Bull HN Information Systems Italia S.p.A., Milan, Italy

[21] Appl. No.: 09/093,276

[22] Filed: Jun. 8, 1998

[30] Foreign Application Priority Data

Jun. 13, 1997 [EP] European Pat. Off. .............. 97830287

[51] Int. Cl.[7] .................................................. G01R 31/28
[52] U.S. Cl. ........................................................... 714/726
[58] Field of Search .................................... 714/724, 726, 714/727, 733, 734, 30

[56] References Cited

U.S. PATENT DOCUMENTS

| | | | |
|---|---|---|---|
| 5,333,139 | 7/1994 | Sturges | 714/727 |
| 5,377,198 | 12/1994 | Simpson et al. | 371/22.3 |
| 5,708,773 | 1/1998 | Jeppesen, III et al. | 714/30 |
| 5,805,607 | 9/1998 | Khu | 714/726 |
| 5,887,001 | 3/1999 | Russell | 714/726 |

*Primary Examiner*—Christine Tu
*Attorney, Agent, or Firm*—Sofer & Haroun, LLP

[57] ABSTRACT

Integrated circuit component with terminals for connection to an external communication channel or bus, serial test interface and a configuration register whose content defines operational modes of the integrated circuit, in which the configuration register is loaded with a default configuration, applied externally, through the serial test interface in the course of an initializing phase in which a reset signal applied to the integrated circuit is asserted and in which the default configuration is modifiable via SW or FW, through the external communication channel when the reset signal is deasserted.

7 Claims, 1 Drawing Sheet

INTEGRATED CIRCUIT WITH SERIAL TEST INTERFACE AND LOGIC FOR LOADING A FUNCTIONAL REGISTER USING SAID INTERFACE

TECHNICAL FIELD

The present invention relates to an integrated circuit with serial test interface, for example of the standardized type known as a JTAG, and defined by the Joint Test Access Group IEEE P1149.1 specifications, and a logic for loading a functional register using said interface.

BACKGROUND OF THE INVENTION

In the commonly used integrated circuits with very large scale integration (VLSI) for data processing systems, which circuits perform a plurality of functions, with high parallelism of the information transferred through input/output terminals, there is the problem of harmonizing wide versatility of operation with the number of input/output terminals or pins of the circuit, for transferring data and control signals, which has to be as limited as possible.

This is necessary for two reasons:

1) Each input/output terminal requires, on the integrated circuit, a connection pad which takes away considerable space from the active part of the chip.
2) Each input/output terminal, in particular if it is to perform control functions, requires internal and external drive logic which increases the complexity of the system, inside and outside the integrated circuit, and its cost.

On the other hand, an integrated circuit has to be as flexible as possible, so as to be able to work, within the same system architecture with different system configurations, whether hardware, software or firmware, if not also for reasons of compatibility of use in different architectures.

This implies, for example, that it must be able to work with several different processors, be able to be inserted into a system under differing modularities, function with different SWs and FWs, and guarantee SW and FW compatibility with other integrated circuits from the same family which exist on the market.

As a specific example, an integrated circuit intended to be connected to a system bus, in particular a bridge unit for interconnection between a system bus and one or more local buses, must be able to recognize itself as being a unit addressed and selected through the system bus.

For this purpose the unit is provided with internal logic which defines a range of addresses, using a base and an upper limit of the range, through which the unit identifies itself as being a selected unit.

In other words, in modern integrated circuits the selection logic of the chip is not external and the chip is not selected by a chip select signal received externally, but internally.

Obviously the selection logic cannot be rigid and predetermined since otherwise several integrated circuits of the same type, connected to the same system bus, would all recognize themselves as being selected devices, contradicting the selection concept.

The selection logic should therefore be programmable.

The programming cannot be fixed, carried out at production level, since this would exclude any possibility of system reconfiguration, but variable depending on the system requirements and able to be carried out automatically by the system each time it is turned on, without the need for external interventions.

However, with this approach the problem is not solved, but merely shifted upstream.

Thus, when the system is turned on, the integrated circuit must be able to configure itself on the basis of information from outside, and hence must first of all identify itself as the destination of the information coming from the outside.

This problem can be solved in two ways.

The first solution is to provide a number of input terminals for control signals which make it possible to interpret the information received on other terminals, as programming information.

Obviously this solution is partial since it is not in harmony with the requirement to minimize the number of terminals.

In many cases it is even impracticable, since it is not possible to provide additional control terminals to perform this function.

The second solution is to provide a dual configuration/logic function for a number of input logic terminals based on the state of another system signal, for example an initializing RESET signal.

In other words, when the system is turned on and the system RESET signal is enabled, a few input terminals of the integrated circuit can perform the role of selection terminals, whilst others can be used to receive information which is used as configuration information.

This solution requires the use, outside the integrated circuit, of logic, necessarily active in the reset phase, for making the logic terminals perform the dual configuration/logic function and greater complexity of the internal logic of the integrated circuit, the lengthening of the logic chain downstream of the input terminals and consequent impairment of the timings and performance of the circuit.

With this solution it is possible to configure the integrated circuit, in the system reset phase, with a programmable "default" configuration, which at the least allows activation of the system.

It is also possible, in the operational phase, to refine and reconfigure the integrated circuit dynamically so as to make it operate in the desired mode, by sending SW or FW instructions which are recognized by the integrated circuit.

However, the greater the information required for configuring the integrated circuit in the reset phase (for example even to define just one window of addresses as the selection range may require as many as 32 bits), the more complex is the external and internal initialization logic.

SUMMARY OF THE INVENTION

It is an object of the present invention to overcome these drawbacks of the prior art.

The present invention in line with this second approach, and as an enhancement thereof, solves the problem discussed above, without the need for extra logic external to the integrated circuit and without burdening the internal logic circuits and impairing its timings.

To this end, in accordance with the present invention, the serial test interface with which modern integrated components of some complexity are furnished, is used not only to test the working of the component but also to define its default configuration, upon initialization of the system.

To this end, a configuration register in which is stored at least that part of the configuration information which is required for component initialization, is connected via a multiplexer (or equivalent input control logic) to the parallel outputs of an input shift register (or "test data register" in JTAG terminology) of the serial test interface logic chain (JTAG).

The multiplexer is controlled by a system Reset signal (separate from the JTAG interface reset signal) for transferring the information loaded into the input buffer of the JTAG interface to the configuration register.

With this simple expedient the configuration register can be loaded, during the system reset phase, using procedures entirely similar to the test procedures envisaged for the JTAG serial interface, with an initial configuration which allows the component to operate and recognize subsequent configuration commands, without the need for any additional control terminal, and without the need for any additional logic circuit, except only for the multiplexing logic.

BRIEF DESCRIPTION OF THE DRAWINGS

The features and advantages of the invention will be made clearer in the description which follows of a preferred embodiment of the invention, given by way of non-limiting illustration with reference to the appended drawings in which.

DETAILED DESCRIPTION OF THE PREFERRED EMBODIMENTS

Figure 1:
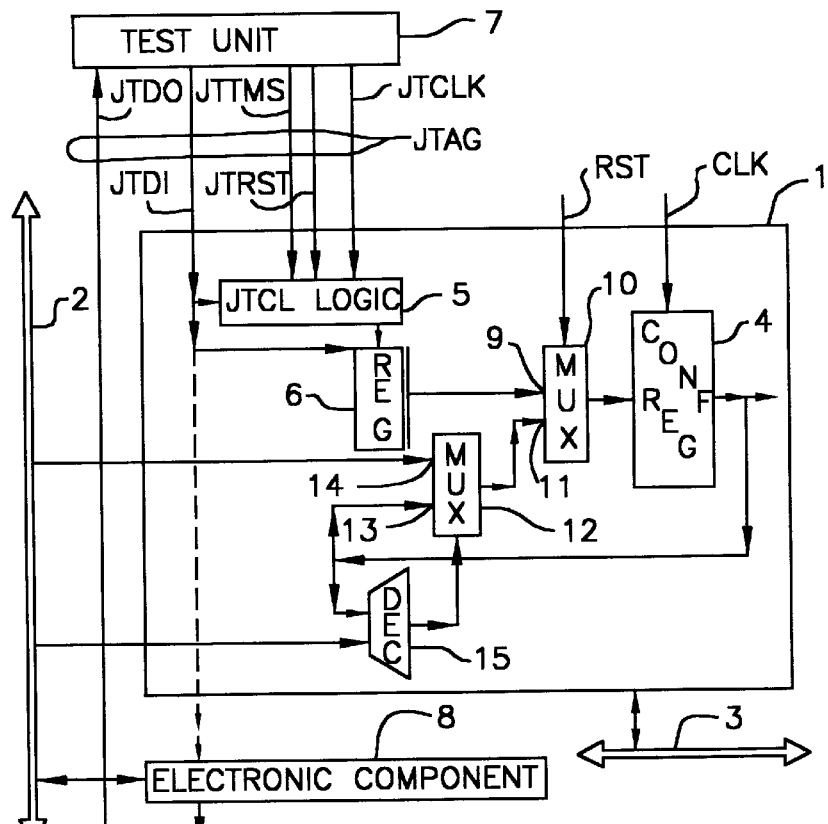
FIG. 1 is a block diagram of an integrated circuit provided with a serial test interface and logic for loading a functional register using this interface, according to a preferred embodiment.

With reference to FIG. 1, an electronic component 1 in integrated circuit form, for example a bridge for interconnection between a system bus 2 and a local bus 3, is provided with a configuration register 4, which is to be loaded with information which defines the operational mode of the component, for example a range of addresses which the component must recognize as being a selection code intended for it.

The component 1 is provided in a known manner with a serial test interface used for inspecting it at the end of the production cycle and for periodically testing it in the course of its use in a system.

The serial test interface, of standard type, known by the acronym JTAG comprises five signals transferred through five similarly named interface wires (and component terminals):

1. JTCLK: periodic clock signal
2. JTTMS: test mode selection signal
3. JTRST: serial interface logic reset signal.
4. JTDI: serial data signal applied as input to the component.
5. JTDO: serial data signal output by the component.

The signals JTCLK, JTTMS, JTRST and JTDI are applied as input to the component 1.

The signal JTDO is output by the component 1.

The signal JTTM has the function of controlling the transition from one state to the other of control logic 5 (JTC.LOGIC), structured as a state machine internal to the component 1.

The control logic 5 has the function of managing the transfer of the JTDI serial data received as input to the component 1, inside the latter, the loading thereof into suitable registers, including an input shift register 6, the only one illustrated. It also has the function of establishing a scan path whereby the content of the various registers concatenated in the scan path can be extracted serially, as JTDO output data.

In particular for a predetermined state of the control logic 5, the serial data received as input can be transferred to the JTDO output terminal, bypassing the scan path or paths which may be prescribed by the control logic.

The signal JTRST, when enabled, has the function of resetting the state machine 5, inside the component 1, and the input buffer 6.

It should be noted that the signal JTRST is entirely independent of the system reset signal RST which can reset the functional registers and the logic of the component.

In this way, even if the signal RST is asserted, the serial interface can be active, receive data at the JTDI input, transfer it to the JTDO output and load it into the register 6.

The signal JTCLK serves to time the operations of the serial interface.

With the rising edge of the signal JTCLK, the signal present at the input JTDI, representative of a test and instruction serial data bit, is sampled.

With the falling edge of the signal JTCLK, a test and instruction serial data bit is output.

With a succession of clock signal pulses JTCLK it is therefore possible to send a string of binary data to the component 1, by means of the serial interface, and to produce as output from the component 1 a string of binary data which constitute the response of the component to the test stimulation and, in the case in which the component 1 is held reset by the enabled signal RST, a copy of the input data, possibly modified by the active serial interface logic.

The signal JTCLK also is independent of a system clock signal CLK which times the component 1 and is active for series (or bursts) of pulses which can be programmed.

The signals JTTMS, JTCLK, JTD and JTRST are generated by a supervisory and test unit 7 which is active even if the system reset signal is enabled.

Several components can be concatenated in the serial interface.

For example, in FIG. 1 it is shown that the test unit 7 sends test data to the component 1 which, in turn, has its JTDO serial data output connected to the JTDI serial data input of another electronic component 8, which in turn has its JTDO serial data output connected to the serial data input of the test unit 7.

Several electronic components can be inserted into the chain between the component 1 and the component 8.

All of these aspects come within the state of the art and are defined by the aforementioned IEEE 1149.1 standard which should be consulted for further details.

The significant aspects, for the purposes of the present invention, are the following:

The input register 6 of the serial interface has its parallel outputs (the register 6 and a shift register) connected to a first group of inputs 9, of a multiplexer 10, which has a second group of inputs 11 connected to the output of a second multiplexer 12.

The multiplexer 10 is controlled by the signal RST (system reset) which, when asserted, permits the transfer as output from the multiplexer of the information present at the group of inputs 9 and, when deasserted, permits the transfer as output of the information present at the group of inputs 11.

The output of the multiplexer 10 is connected to the input of the configuration register 4.

The latter is controlled by the system clock signal CLK.

It should be noted that the configuration register 4 is not controlled by the signal RST, i.e. is not reset when RST is asserted.

In this way, in the reset phase, the information present at the output from the register 6 is loaded into the register 4 and, if this information changes, the content of the register 4 is periodically updated with each pulse of the clock signal CLK.

In this way, by using the serial test interface it is possible, without the need for extra input terminals, and without the need for additional logic circuits, only excluding the multiplexer 10, progressively to load, in the course of the system reset phase, when it is turned on, the register 6 and to transfer its content into the configuration register 4.

It is therefore possible to prime the register 4 with an initializing or default control configuration which, instead of being fixed and immutable, is prescribed externally depending on the system configuration and on the operational modality required of the component 1.

In FIG. 1 the register 4 is preferably controlled by the clock signal CLK for reasons which will be seen hereinafter.

However, there is nothing to prevent the loading thereof from being performed once and for all, using the deasserting edge of the signal RST as a load command.

In other words the register 4 can be a latch register, controlled by the signal RST.

More advantageously however, as illustrated, the register 4 is controlled by the periodic signal CLK.

This makes it possible to modify the content of the register 4, and hence the configuration of the component 1, dynamically in the course of its operation, when the signal RST is deasserted.

To this end, the multiplexer 12 has a first group of inputs 13 connected to the output of the register 4 and a second group of inputs 14 connected to the system bus 2, in particular to a data channel of the system bus.

The multiplexer 12 is controlled by an input selection signal SEL.

Depending on whether the signal SEL is deasserted or asserted, the multiplexer transfers as output respectively the information present at the first group of inputs 13 or at the second group of inputs 14.

In this way, when SEL is deasserted, the content of the register 4 is periodically reconfirmed with each pulse of the clock signal CLK, whereas when SEL is asserted, configuration information coming from the system bus can be loaded into the register 4.

The signal SEL is generated by a decoding logic or decoder 15, which receives as input both information output by the register 4 and also information present on the system bus, in particular on an address channel of the system bus.

Thus, depending on the component configuration defined by the content of the register 4, it is possible to identify on the system bus, messages intended for the component 1 which call for a change in its configuration.

On recognizing the component 1 as destination the decoder 15 asserts the signal SEL and the information present on the system bus, more properly on the data channel of the bus, is transferred via the multiplexer 12 and from there, via the multiplexer 10 (the signal RST is disabled), to the register 4 where it is loaded.

In conclusion the system idle phase which occurs on turning on the system, when the reset signal RST is asserted, is beneficially exploited in order to load an initial default configuration into the configuration register, via the serial test interface.

This allows the system to commence activities and is compatible with subsequent changes via SW or FW of the initial configuration.

The embodiment described in the figure is merely a preferred embodiment and many variations may be introduced.

For example the two multiplexers 10 and 12 can consist of a single multiplexer with three input pathways, operated in selection by the two signals RST or SEL.

Figure 2:
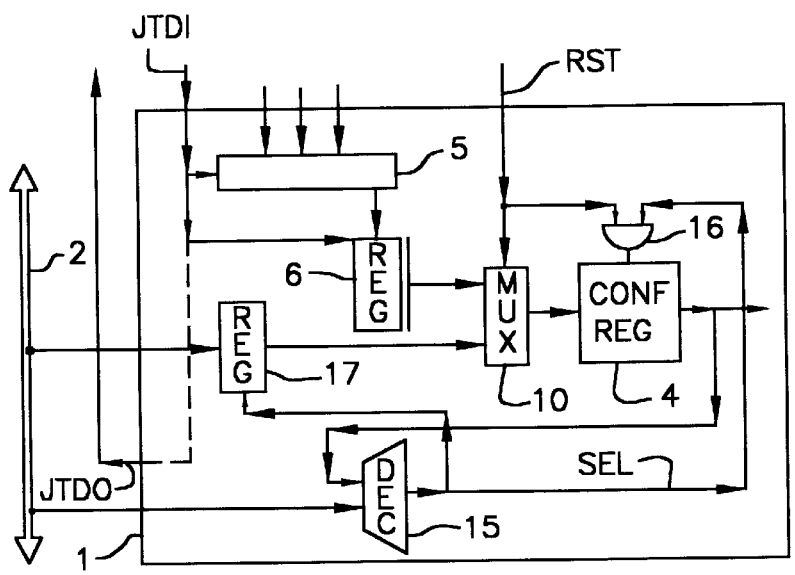
FIG. 2 is a block diagram of a variant of the integrated circuit of FIG. 1.

Another possible variant is shown in FIG. 2, where elements functionally equivalent to those of FIG. 1 are identified by the same numerical references.

Given that the asserted/deasserted logic level of the signals is, by convention the negation of the electrical level, hence the signals RTS and SEL when asserted are at zero electrical level, and when deasserted are at positive electrical level, the latch-type register 4 is placed in the latch state, by asserting one or other of the signals RST, SEL through the AND gate 16.

The multiplexer 10 has its second group of inputs connected to the data channel of the system bus 2.

At the termination of the RESET phase the signal SEL is certainly deasserted (at electrical level 1).

When the signal RST also is deasserted, the information present at the input of the register 4 and corresponding to the information present in the register 6, transferred via the multiplexer 10, is frozen (latched) in the register 4.

In the working phase, when the signal RST is deasserted (at positive electrical level) the signal SEL is itself also, in general, deasserted and the configuration loaded in the register 4 is not modified.

However if, through the recognition on the part of the decoding logic 15 of a configuration modify command, the signal SEL is asserted, the register 4 is made able to receive, through the multiplexer 10, the information present on the system bus.

When the signal SEL is deasserted, this information is frozen in the register 4.

This solution presupposes that the information to be loaded into the register 4 is present at the input of the register 4 at least up to the instant at which the signal SEL is deasserted.

This does not constitute a problem since in general the electronic components connected to a system bus are provided with a buffer register 17 for data input which ensures the necessary permanence of the data at input for as long as necessary, even if the information is removed from the bus.

It will be clear that the connecting of the integrated electronic component 1 to a system bus is purely illustrative and that the electronic component can be connected to any external channel for transferring information, such as a local bus, to which several integrated components are connected, or a point-to-point channel for interconnecting an integrated component such as 1 and another electronic component, such as a microprocessor, an input output control unit or the like.

What is claimed is:

1. An integrated circuit component with terminals for connection to an external communication channel or bus, an initializing reset signal input and a serial test interface, wherein said integrated circuit component comprises:

a configuration register whose content defines operational modes of said component;

loading means, wherein said loading means is controlled by said reset signal and is configured, when said reset signal is asserted, to load said configuration register, through said serial test interface, with configuration information applied as input to said integrated circuit component;

a decoder with inputs connected to the output of said configuration register, wherein said decoder is configured to determine whether information on said communication channel or bus is configuration information directed to said integrated circuit component and if so, is further configured to assert a corresponding selection signal; and multiplexing means configured to receive and be controlled by said reset signal and by said selection signal such that, when said reset signal is deasserted and said selection signal is asserted, said multiplexing means applies as input to said configuration register said configuration information received from said external communication channel.

2. Integrated circuit component according to claim 1, in which said configuration register is controlled by a periodic clock signal and said multiplexing means have a group of inputs for receiving the information output by said configuration register and reapplying same as input to said configuration register when both of said reset and selection signals are deasserted.

3. An integrated circuit component with terminals for connection to an external communication channel or bus, an initializing reset signal input and a serial test interface, wherein said integrated circuit component comprises:

a configuration register configured to store values defining an address range;

loading means, wherein said loading means is controlled by said reset signal and is configured, when said reset signal is asserted, to load said configuration register, through said serial test interface, with configuration information applied as input to said integrated circuit component.

4. The integrated circuit component according to claim 3, wherein said values defining an address range comprise a base and upper limit of said range.

5. The integrated circuit component according to claim 3, further comprising a decoder with inputs connected to the output of said configuration register, wherein said decoder is configured to determine whether information on said communication channel or bus is configuration information directed to said integrated circuit component and if so, is further configured to assert a corresponding selection signal.

6. The integrated circuit component according to claim 3, further comprising multiplexing means configured to receive and be controlled by said reset signal and by said selection signal such that, when said reset signal is deasserted and said selection signal is asserted, said multiplexing means applies as input to said configuration register said configuration information received from said external communication channel.

7. The integrated circuit component according to claim 6, in which said configuration register is controlled by a periodic clock signal and said multiplexing means have a group of inputs for receiving the information output by said configuration register and reapplying same as input to said configuration register when both of said reset and selection signals are deasserted.

* * * * *